United States Patent
Botti et al.

[11] Patent Number: 5,535,082
[45] Date of Patent: Jul. 9, 1996

[54] TURN-ON CONTROL CIRCUIT FOR ELECTRIC DEVICES

[76] Inventors: Edoardo Botti, 27029 Vigevano, Via Battù 16/D, Italy; Andrea Fassina, 20155 Milano, Via Ercolano, 3, Italy

[21] Appl. No.: 69,283

[22] Filed: May 28, 1993

[30] Foreign Application Priority Data

May 29, 1992 [EP] European Pat. Off. ............. 92830281

[51] Int. Cl.⁶ .................................................. H02H 7/00
[52] U.S. Cl. .................. 361/18; 361/29; 361/54; 361/56
[58] Field of Search ................ 361/18, 29, 54, 361/56; 307/358, 361, 546, 360; 323/901

[56] References Cited

U.S. PATENT DOCUMENTS

| 4,146,847 | 3/1979 | Otao et al. | 330/297 |
| 4,517,618 | 5/1985 | Frank | 361/58 |
| 4,638,507 | 1/1987 | Palara et al. | 381/94 |
| 5,202,590 | 4/1993 | Liepold et al. | 307/362 |

FOREIGN PATENT DOCUMENTS

| 0368528 | 5/1990 | European Pat. Off. | H03G 3/34 |
| 3428441 | 2/1986 | Germany | H02H 5/00 |

*Primary Examiner*—Brain K. Young
*Assistant Examiner*—Sally C. Medley

[57] ABSTRACT

A turn-on control circuit having a comparator supplied with a turn-on voltage increasing gradually during the turn-on phase of a device for protection. When the control voltage reaches a predetermined value, the comparator supplies a diagnostic enabling signal to a diagnostic stage, which, in the event an undesired condition is detected at an output of the device, supplies a clamp enabling signal to the control terminal of a clamping transistor located between the input of the circuit and ground, and which, when enabled, prevents the turn-on voltage from increasing further, and so prevents the device from being turned on.

20 Claims, 2 Drawing Sheets

5,535,082

TURN-ON CONTROL CIRCUIT FOR ELECTRIC DEVICES

TECHNICAL FIELD

The present invention relates to a turn-on control circuit for devices, in particular power devices, having a circuit for detecting error, fault or otherwise undesired conditions. The present invention is particularly suitable for devices having an input supplied with an electric quantity, which, when the device is turned on, switches gradually from a first to a second steady-state value, such as those with a standby input (to which the following description refers purely by way of example), which are designed to switch from a standby state wherein the voltage at the standby input is low, to an operating (play) state. Typical devices of this sort are audio amplifiers to which the following description refers.

BACKGROUND OF THE INVENTION

On audio amplifiers, errors or faults may occur at times on the connections between the amplifier outputs and the load (loudspeakers). For example, the output may be grounded or connected to the supply line for want of insulation of the cable supplying the signal to the load; the load may be disconnected due to an interruption on the signal supply cable; or metal fragments on the printed circuit on which the connections are made may result in short-circuiting of the outputs or at points of different potential.

SUMMARY OF THE INVENTION

When such faults occur prior to turning on the amplifier, this may supply or absorb an excessive amount of current which may damage the amplifier when it is turned on.

It is an object of the present invention to provide a circuit designed to overcome the above problem by preventing the controlled device from assuming anomalous or indeed dangerous conditions, and which, more specifically, provides for detecting faults prior to turn-on of the device, and for preventing the device from being turned on as long as such faults persist.

The present invention is, of course, defined by the claims, but a summary of the present invention is as follows.

According to the present invention, upon detection of a potentially dangerous condition, or at any rate such a condition that may result in undesired consequences (hereinafter referred to as faults), a clamping element connected to the input of the circuit is activated that prevents any further increase in the input voltage and so prevents the device from being turned on.

The system according to the present invention is particularly suitable for amplifiers connected permanently to the supply, such as those with a standby input compatible with logic levels.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 1:
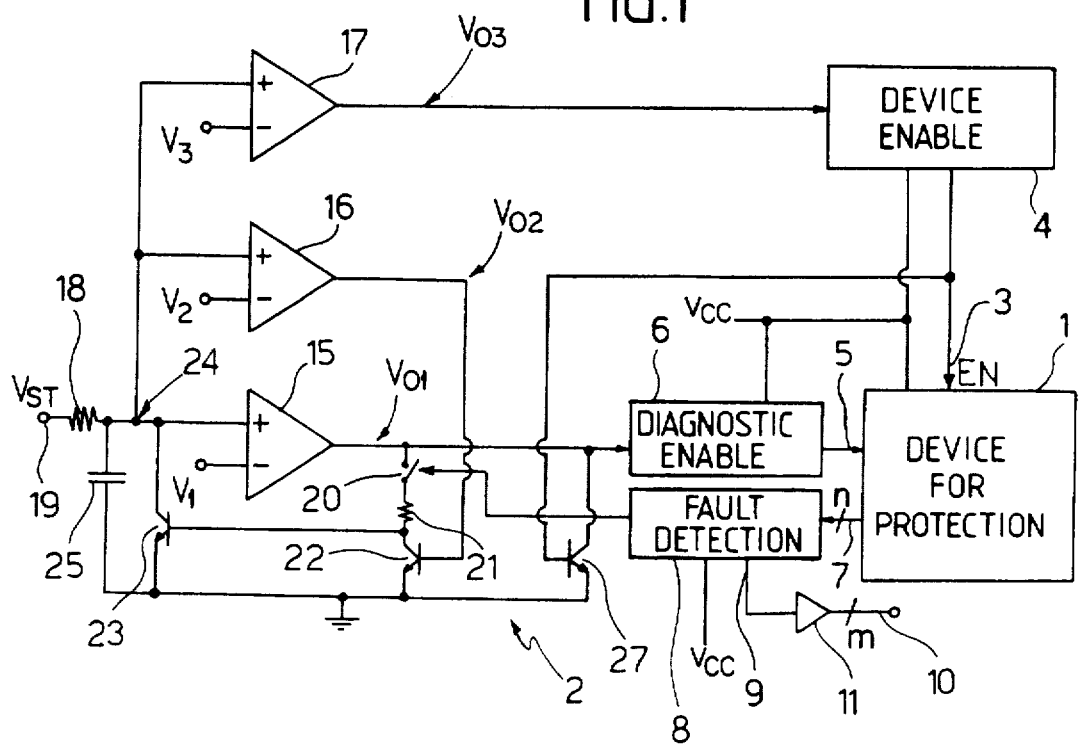
FIG. 1 shows a block diagram of a first embodiment of the circuit according to the present invention.

Number 1 in FIG. 1 indicates thee device for protection (in this case, an audio amplifier), and number 2 the turn-on control circuit. Device 1 is presented with an enabling input 3 (EN) connected to the output of a device enabling block 4 containing all the voltage and current sources necessary for operation of device 1. The device 1 also includes an input 5 connected to the output of a diagnostic enabling block 6 containing all the voltage and current sources required for pre-turn-on diagnosis and an output 7 (of n lines) connected to the input of a fault detecting block 8 for detecting any undesired conditions which may result in faulty operation of device 1. Fault detecting block 8 is a known device that (which, together with diagnostic enabling block 6, forms a fault detecting stage) presents an output 9 to which any information relative to the presence of undesired conditions is supplied, and which is connected to m number of lines 10 (one for each possible malfunctioning condition) having a buffer circuit 11.

Circuit 2 also comprises three comparators 15, 16, 17 having their positive inputs connected (via resistor 18) to a standby input 19 supplied with standby voltage $V_{ST}$ and their negative inputs connected to respective reference potentials, $V_1$, $V_2$, $V_3$, where $V_1<V_2<V_3$. The output of comparator 15 (potential $V_{o1}$) is connected to an enabling input of the diagnostic enabling block 6 and to one terminal of a controlled switch 20. The controlled switch 20 includes a control terminal connected to one output of fault detecting block 8 and another terminal connected via a resistor 21 to the collector of an NPN type transistor 22. The transistor 22 is a disabling element having its base connected to the output of comparator 16 (potential $V_{o2}$) and its emitter grounded (reference potential). The collector of transistor 22 is also connected to the base of a second NPN type transistor 23 (defining a clamping element) having its emitter grounded and its collector connected to a common node 24 of the positive inputs of comparators 15–17. Between node 24 and ground, provision is made for a capacitor 25 defining a low-pass filter with resistor 18.

The output of comparator 17 (potential $V_{o3}$) is connected to the enabling input of device enabling block 4; and a third NPN type transistor 27 (defining a diagnostic disabling element) presents its collector connected to the output of comparator 15, its base connected to the output of device enabling block 4, and its emitter grounded.

With the exception of the low-pass filter defined by the resistor 18 and the capacitor 25, the control circuit 2 is preferably integrated on the same chip as device 1.

The FIG. 1 circuit operates as follows:

Supposing potential $V_{ST}$ controls the operating state of the device (low=off, high=on), that it is lower than $V_1$, $V_2$, $V_3$, before turning on the device, and that it increases gradually to a value greater than $V_3$ after the device is turned on.

Before the device is turned on, when $V_{ST}=0$, the outputs of comparators 15–17 are zero, and blocks 4, 6, and 8 are off.

In the absence of undesired conditions ("faults"), the increase in $V_{ST}$ presents the following phases:

(1) $V_{ST}<V_1$

In this phase, by virtue of the low output of comparator 17, blocks 4, 6, and 8 and device 1 remain off, and no external signal is supplied over lines 10.

(2) $V_1 < V_{ST} < V_2$

In this phase, output potential $V_{o1}$ of comparator 15 is high, thus enabling diagnostic enabling block 6, for determining the presence of any error conditions; $V_{o2}$ is low, so that transistor 22 remains off; and $V_{o3}$ is also low, so that device enabling block 4 is disabled and device 1 remains off.

If no error condition is detected, the output of fault detecting block 8 remains low, so that controlled switch 20 remains open, transistor 23 remains off, and voltage $V_{ST}$ continues increasing normally.

Conversely, in the event of an error condition being detected, the output of fault detecting block 8 switches to high, so as to supply an error output signal over line 10 and close switch 20; and transistor 23 is turned on, thus closing a negative feedback loop also comprising comparator 15 and resistor 21, and so preventing voltage $V_{ST}$ from increasing further. The stability of the feedback loop is guaranteed by capacitor 25. Consequently, as long as the error condition detected by block 8 persists, $V_{ST}$ is maintained low and prevented from reaching thresholds $V_2$, $V_3$, by transistor 23, so that the feedback loop remains on, and block 4 and device 1 remain off.

(3) $V_2 < V_{ST} < V_3$

This phase depends on no error condition being detected or, conversely, on the error being eliminated beforehand, in which case, the output of comparator 16 switches to high, thus turning on and saturating transistor 22, and transistor 23 remains off, thus preventing voltage $V_{ST}$ from being clamped under normal operating conditions and so enabling it to increase to the steady-state value.

(4) $V_3 < V_{ST}$

When this applies, the output of comparator 17 switches so as to enable device enabling block 4 and turn on the sources of device 1 and, consequently, device 1 itself. When enabled, block 4 also turns on transistor 27, which grounds the output of comparator 15, thus disabling the diagnostic system (blocks 6, 8), so that device 1 operates normally.

Figure 2:
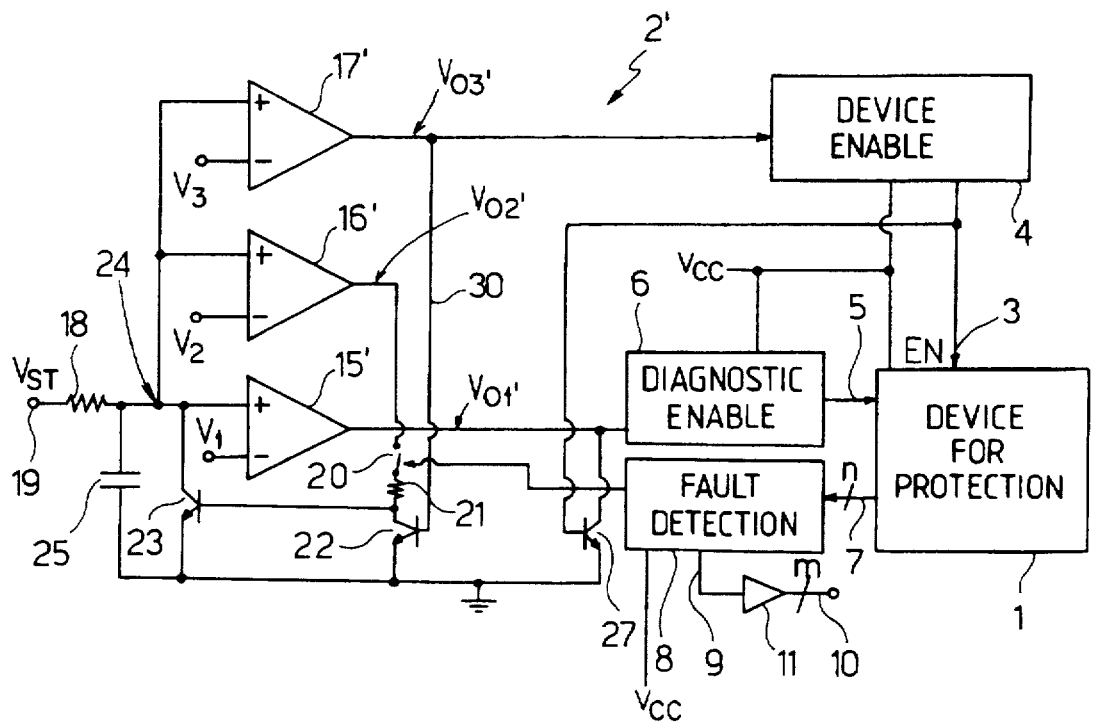
FIG. 2 shows a block diagram of a first variation of the circuit according to the present invention.

FIG. 2 shows a variation 2' of circuit 2 in FIG. 1.

Circuit 2' is similar to that of FIG. 1, and again comprises three comparators 15', 16', 17' supplying respective output potentials $V_{o1}'$, $V_{o2}'$, $V_{o3}'$; blocks 4, 6, 8; transistors 22, 23, 27; switch 20; and capacitor 25. The only difference as compared with circuit 2 lies in the connection of the outputs of comparators 16' and 17' to switch 20 and transistor 22, and more specifically in the fact that, instead of controlling the base of transistor 21, the output of comparator 16' is connected to one terminal of switch 20 (the other terminal of which is again connected to resistor 21); while the base of transistor 22 is connected directly to the output of comparator 17' over line 30.

Like comparator 15 in FIG. 1, comparator 15' in circuit 2' provides for enabling the diagnostic functions by enabling block 6 as soon as voltage $V_{ST}$ exceeds $V_1$. In the event of a fault being detected by block 8, this closes switch 20 while still allowing voltage $V_{ST}$ to reach $V_2$ by virtue of the fact that, previous to $V_2$, the output of comparator 16' is still low, and transistor 23 remains off. Conversely, in the event of a fault being detected, as soon as $V_{ST} > V_2$ the output of comparator 16' switches to high, thus turning on transistor 23 and preventing any further increase in $V_{ST}$ as long as the fault persists; and switch 20 is maintained closed by the output of fault detecting block 8. In the absence of or following removal of any faults, as $V_{ST}$ exceeds $V_3'$ the output of comparator 17' also switches, which, in addition to enabling device 1, enabling block 4 also turns on transistor 22 so as to disable the voltage clamping loop, after which transistor 27 again provides for disabling operation of the diagnostic system.

The FIG. 2 variation is ideal in situations in which the enabling phase of diagnostic enabling block 6 may result in spurious output signals being supplied to fault detecting block 8, thus turning on transistor 23 and so preventing device 1 from being turned on even in the absence of a fault at outputs 7. This possibility is prevented by circuit 2' by virtue of $V_{ST}$ only being clamped when $V_{ST} > V_2$, i.e., when diagnostic enabling block 6 is fully operative and therefore no longer in any condition to produce spurious output signals.

Figures 3, 4:
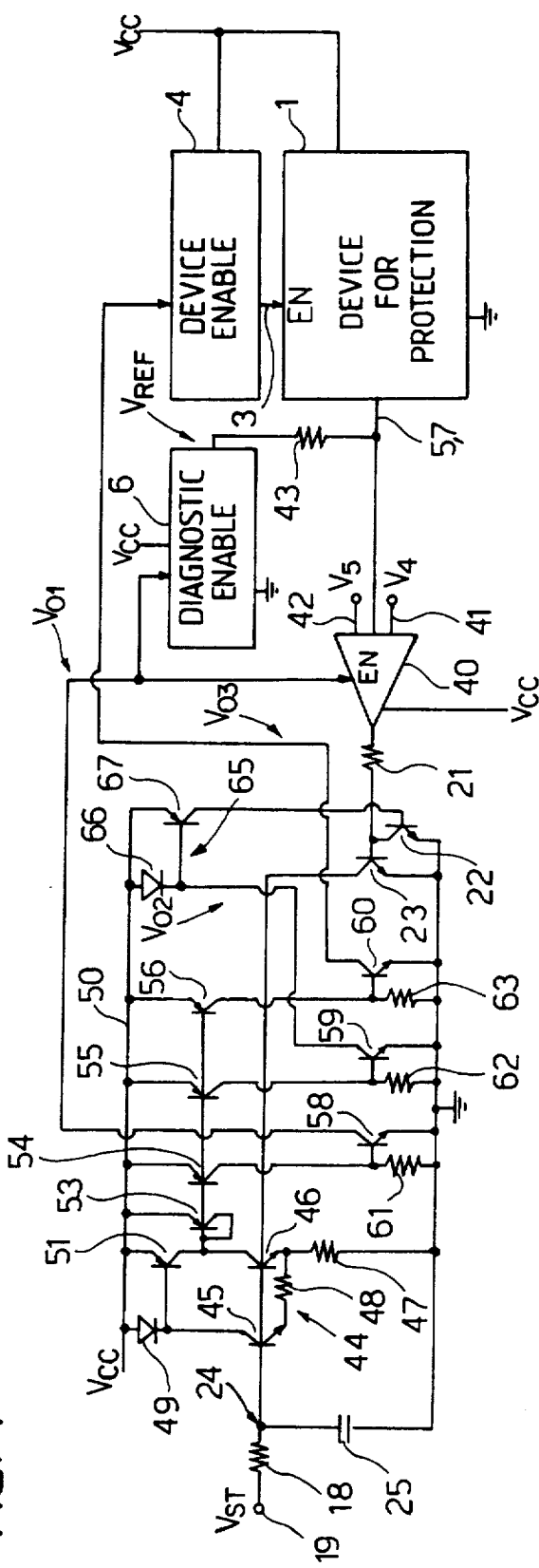
FIG. 3 shows a block diagram of a second variation of the circuit according to the present invention.
FIG. 4 shows a circuit diagram implementing the FIG. 1 block diagram.

FIG. 3 shows a further variation 2" of the turn-on control circuit similar to that of FIG. 1 and comprising blocks 4, 6, 8, and transistors 22, 23, 27 that correspond in function and structure to like-numbered blocks of FIGS. 1 and 2. In this case, however, provision is made for two comparators 15" and 17" having the positive inputs connected to respective threshold potentials $V_1$ and $V_3$ and supplying respective output potentials $V_{o1}"$ and $V_{o3}"$; the terminal of switch 20 not connected to resistor 21 is connected directly to the output of comparator 15"; and the base of transistor 22 is connected directly to the output of comparator 17" over line 30. The remainder of circuit 2" is identical to that of FIGS. 1 and 2.

In the event of a fault being detected by block 8, input voltage $V_{ST}$ in the FIG. 3 circuit is clamped immediately, and the feedback loop is disabled by comparator 17" as soon as device 1 is turned on.

Circuit 2" is thus extremely straightforward in design, and suitable for situations in which no danger exists of spurious signals being supplied when diagnostic enabling block 6 is turned on or during the final phase in the increase of input voltage $V_{ST}$.

FIG. 4 shows a circuit diagram implementing the FIG. 1 block diagram.

FIG. 4 shows resistor 18 between input 19 and node 24; capacitor 25 between node 24 and ground; and transistor 23 having the collector connected to node 24, the emitter grounded, and the base connected via resistor 21 to the output of a range comparator 40 implementing fault detecting block 8 and switch 20. Range comparator 40 presents two inputs 41, 42 set to respective threshold potentials $V_4$, $V_5$, where $V_4 < V_5$; and a third input connected to output 7 of device 1. In the example shown, output 7 coincides with input 5 of device 1, and is connected to the output of diagnostic enabling block 6 via a resistor 43. Block 6 implements, among other things, a reference voltage source, wherein:

$V_{REF} < V_{CC}$.

Numerous circuits for generating reference voltage $V_{REF}$ are known in the art and any of them can be used. Further, numerous other known circuits can be used to implement the device enabling block 4, diagnostic enabling block 6, and fault detection block 8.

It should be appreciated that the aim of the circuit shown in FIG. 4 is to identify fault conditions before the device 1 is turned on, when the standby voltage increases from a low to a high value, in particular to point out the presence of points (connected to terminal 5, 7) which are incorrectly tied to ground or to power supply voltage. Conversely, if the fault (connection to terminal 5, 7 to power supply or to ground) occurs during the standby condition (signal $V_{ST}$ in the low state), terminal 5, 7 changes its voltage level, which is detected in a subsequent moment, when the standby voltage switches from low to high. As such, the voltage on terminal 5, 7 can be $V_{CC}$, ground or an intermediate voltage and may be in a floating state before the device is turned on.

The FIG. 4 circuit also comprises a band-gap voltage source stage 44 including a pair of NPN type transistors 45, 46 having respective emitter areas $A_1$ and $A_2$ where $A_1 > A_2$. The base terminals of transistors 45, 46 are connected to each other and to node 24; the emitter terminal of transistor 46 is grounded via resistor 47; the emitter terminal of transistor 45 is connected to that of transistor 46 via a second resistor 48 (of resistance $R_1$,); the collector terminal of transistor 45 is connected to the cathode of a diode 49 having its anode connected to a supply line 50 set to potential $V_{CC}$; and the collector terminal of transistor 46 is connected to that of a PNP type transistor 51 having its emitter connected to line 50, and its base connected to the cathode of diode 49.

The collector terminal of transistor 51 is also connected to the base terminal of a diode-connected PNP type transistor 53 having its collector short-circuited to the base, and its emitter terminal connected to line 50. The collector terminal of transistor 51 is also connected to the base terminals of three PNP type transistors 54, 55, 56, each forming a respective current mirror circuit with transistor 53. Transistors 54, 55 and 56 present emitter terminals connected to line 50, and collector terminals connected to the base terminals of respective NPN type transistors 58, 59, 60, the emitter terminals of which are grounded. Between the base terminals of transistors 58, 59, 60 and ground, there are provided respective resistors 61, 62, 63 having respective resistances $R_2$, $R_3$, $R_4$, where $R_2 > R_3 > R_4$. The collector terminal of transistor 58 (forming comparator 15 together with transistor 54 and resistor 61) is connected to the enabling input of diagnostic enabling block 6 and range comparator 40; the collector terminal of transistor 59 (forming comparator 16 together with transistor 55 and resistor 62) is connected to the input of a current mirror circuit 65 including a diode 66 (having its anode connected to line 50 and its cathode to the collector of transistor 59) and a PNP type transistor 67 (connected by the emitter terminal to line 50, by the base terminal to the cathode of diode 66, and by the collector terminal to the base terminal of transistor 22); and the collector terminal of transistor 60 (forming comparator 17 together with transistor 56 and resistor 63) is connected to the enabling input of device enabling block 4. As shown, the device for protection block 1, device enable block 4, diagnostic enable block 6, and range comparator 40 are each connected to the power supply $V_{CC}$ to receive power when enabled as described below.

The FIG. 4 circuit operates as follows:

Band-gap source 44 starts supplying diode-connected transistor 53 when input voltage $V_{ST}$ is such that voltage $V_{R1}$ at the terminals of resistor 44 equals:

$$V_{R1} = 0.026 \text{ mV ln } (A1/A2)$$

After this value, diode 53 is supplied with current equal to the difference between the currents in components 49 and 51 (collector currents of transistors 45 and 46) which in turn are related in known manner to input voltage $V_{ST}$. Consequently, as input voltage $V_{ST}$ increases, the drive current of transistor 53 and thus current I through the transistor also increases, which current I is mirrored in transistors 54, 55 and 56 and supplied to resistors 61, 62 and 63, thus causing a voltage drop at the base-emitter junction of respective transistors 58–60. Transistors 58–60 are turned on as soon as the voltage drop at the respective base-emitter junction reaches roughly 0.7 V. Therefore, by virtue of $R_2 > R_3 > R_4$, the increase in $V_{ST}$ first turns on transistor 58 followed by transistor 59 and, finally, transistor 60.

As soon as it is turned on, transistor 58 generates a collector voltage $V_{o1}$ capable of enabling the voltage source implemented by block 6 and range comparator 40, so that block 6 supplies reference output voltage $V_{REF}$ to terminal 5, 7 of device 1, which in this phase is in a tristate condition. If terminal 5, 7 is not grounded or switched to $V_{CC}$, it therefore switches to $V_{REF}$, so that comparator 40 presents a low output, transistor 23 remains off, and voltage $V_{ST}$ may continue rising until it reaches the value at which transistor 59 is turned on, thus turning on current mirror 65 and transistor 22, and preventing transistor 23 from being turned on even when, under normal operating conditions of device 1, the voltage at output 5, 7 exceeds $V_5$ or falls below $V_4$.

As $V_{ST}$ continues rising, transistor 60 is also turned on, which enables block 4 for turning on device 1. Though not shown, in this case also, the collector terminal of transistor 60 may obviously drive transistor 27 for disabling diagnostic enabling block 6.

Conversely, if output 5, 7 of device 1 switches to 0 V or $V_{CC}$ when transistor 58 and diagnostic enabling block 6 are turned on, the output of range comparator 40 switches to high, thus turning on transistor 23, which clamps voltage $V_{ST}$ at node 24 to an intermediate value lower than that at which transistors 59 and 60 are turned on, and the circuit is maintained in this condition until the fault causing the output to be grounded or switched to $V_{CC}$ is rectified.

Those skilled in the art will understand that because the emitters of transistors 58 and 60 are tied to ground, the signals $V_{o1}$ and $V_{o3}$ supplied from the collectors of transistors 58 and 60 respectively are driven low when the transistors are turned on. As a result, the device enabling block 4, diagnostic enabling block 6, and the range comparator 40 preferably include biasing elements, such as a simple PNP transistor (biased through a resistor) that is driven at its base by the collector of transistor 58 or 60. Alternatively, other known biasing arrangements can be used to enable one or more of the device enabling block 4, diagnostic enabling block 6, and range comparator 40.

The advantages of the circuit according to the present invention will be clear from the foregoing description. In particular, it provides for preventing the device from being turned on under potentially dangerous conditions, even if no other protection is provided for.

Moreover, it is straightforward in design; provides for trouble-free application at the design stage to devices with standby inputs, particularly amplifiers, which, for practically all TV, car radio and home HI-FI applications, present a standby function; and can be adapted to cater to any hazardous or at any rate undesired condition by simply designing the diagnostic enabling and fault detecting blocks accordingly.

The circuit may also be employed for supplying diagnostic signals to the user (person or control microprocessor) and so enabling any problems detected to be eliminated by the user. This is particularly useful when assembling the equipment featuring the controlled device (e.g., audio amplifier) for enabling any faulty connections to be detected and rectified prior to sale. While the detection of only two fault conditions, i.e., connection of terminal 5, 7 to ground or the power supply $V_{CC}$, are discussed, it will be known to detect other fault conditions based on the discussion herein.

The circuit provides for supplying simple output information (e.g., the signal produced by one or more open-collector type outputs) or complex information (e.g., via a serial or parallel bus), and requires no particular processing speed on the part of the user, by virtue of the device remaining protected as long as the fault persists. Moreover, once the fault is rectified, the turn-on sequence continues automatically, with no need for restarting or resetting the turn-on voltage.

The circuit according to the present invention is also compatible with any diagnostic system operating during normal operation of the amplifier, even using the same fault detecting block and the same output buffer.

To those skilled in the art it will be clear that changes may be made to the circuit as described and illustrated herein, without, however, departing from the scope of the present invention. For example, as already stated, the diagnostic enabling and fault detecting blocks may be of different known types; the device for protection may be an audio amplifier, a less complex stage, or even a more complex unit; the circuit may be integrated with the device or formed separately; and, as opposed to the different sizing of resistors 61–63, transistors 58–60 in the FIG. 4 circuit may be turned on sequentially by providing drive transistors 54–56 with different emitter area ratios so that they are turned on by different base currents.

We claim:

1. A circuit for turn-on control of a device requiring protection against undesired conditions, comprising:

a turn-on input terminal supplying an electric turn-on control signal whose amplitude varies in value during turn-on;

a fault detecting stage connected to the device, the fault detecting stage generating a fault signal upon detecting an undesired condition;

first comparing means having an input connected to said turn-on input terminal, and an output connectable to said fault detecting stage, said first comparing means generating a diagnostic enabling signal at its output when said turn-on control signal presents a first value;

a clamping element having an enabling terminal supplied with a clamp enabling signal, and a clamping terminal connectable to said input of said first comparing means, for preventing said turn-on control signal from varying in the presence of said clamp enabling signal;

circuit means connectable to said fault detecting stage and connected to said enabling terminal of said clamping element, said circuit means providing said clamp enabling signal in the presence of said fault signal;

second comparing means having an input connected to said turn-on input terminal, and an output generating a device enabling signal when said turn-on control signal presents a second value higher than said first value; and a device enabling stage having an input connected to the output of the second comparing means and output connected to said device, the device enabling stage turning on the device upon receiving the device enabling signal from the second comparing means.

2. A circuit as claimed in claim 1 wherein said turn-on control signal is a voltage increasing gradually during turn-on.

3. A circuit as claimed in claim 1, further comprising third comparing means having an input connected to said turn-on input terminal, and an output generating an enabling signal when said turn-on control signal presents a third value higher than said first value and lower than said second value wherein said circuit means is connected to the output of said second comparing means; and wherein said clamping element defines a negative feedback element between said turn-on input terminal and said output of said second comparing means.

4. A circuit as claimed in claim 1 wherein said clamping element includes a transistor having a first terminal connected to said turn-on input, a second terminal connected to a reference potential line, and a control terminal connected to said circuit means.

5. A circuit as claimed in claim 1 wherein said circuit means comprises a switch located between said output of said first comparing means and said enabling terminal of said clamping element, and having a control terminal connected to said fault detecting stage.

6. A circuit as claimed in claim 1, further comprising a disabling element having a control terminal connected to said output of said second comparing means, and a terminal connected to said enabling terminal of said clamping element, the disabling element generating a signal disabling said clamping element in the presence of said device enabling signal.

7. A circuit as claimed in claim 6 wherein said disabling element comprises a bipolar transistor having a base terminal connected to said output of said second comparing means.

8. A circuit as claimed in claim 1, further comprising a diagnostic disabling element connected to said fault detecting stage and having a control terminal connected to said output of said device enabling stage.

9. A circuit as claimed in claim 8 wherein said diagnostic disabling element comprises a transistor having a first terminal connected to said fault detecting stage and a second terminal connected to a reference potential line.

10. A circuit as claimed in claim 1, further comprising:

third comparing means having an input connected to said turn-on input terminal, and an output connected to said circuit means for generating said clamp enabling signal when said turn-on control signal presents a third value higher than said first value and lower than said second value;

a disabling element having a control terminal connected to said output of said third comparing means, and a disabling terminal connected to said enabling terminal of said clamping element, the disabling element generating a signal disabling said clamping element in the presence of a clamp disabling signal; and wherein said circuit means comprises a switch located between said output of said third comparing means and said enabling terminal of said clamping element, and having a control terminal connected to said fault detecting stage.

11. A circuit as claimed in claim 1, further comprising:

a controlled current source circuit having a control input connected to said turn-on input terminal and an output, and generating a current correlated to said turn-on control signal;

a current mirror circuit having an input connected to said output of said current source circuit and an output; and a transistor element having a first terminal defining said output of said first comparing means, a second terminal connected to a reference potential line, and a control terminal connected to said output of said current mirror circuit; a resistive element being provided between said control terminal of said transistor element and said reference potential line.

12. A circuit as claimed in claim 1, wherein said circuit means is connected to the output of said first comparing means and wherein said clamping element defines a negative feedback element between said turn-on input terminal and said output of said first comparing means.

13. A circuit as claimed in claim 1, further comprising:

third comparing means having an input connected to said turn-on input terminal and an output generating a clamp disabling signal when said turn-on input terminal presents a third value higher than said first value and less than said second value; and a disabling element having a control terminal connected to said output of said third comparing means, and a terminal connected to said enabling terminal of said clamping element, the disabling element generating a signal disabling said clamping element in the presence of said clamp disabling signal.

14. A circuit for turn-on control of a device requiring protection against undesired conditions, said circuit comprising:

a turn-on input supplied with an electric turn-on control quantity varying in value during turn-on;

a fault detecting stage connected to the device, the fault detecting stage generating a fault signal upon detecting an undesired condition;

first comparing means having an input connected to said turn-on input, and an output connected to said fault detecting stage, said first comparing means generating a diagnostic enabling signal at its output when said electric turn-on control quantity presents a first value;

a clamping element having an enabling terminal supplied with a clamp enabling signal, and a clamping terminal connectable to said input of said first comparing means, for preventing said electric turn-on control quantity from varying in the presence of said clamp enabling signal;

circuit means connected to said fault detecting stage and said enabling terminal of said clamping element, for providing said clamp enabling signal in the presence of said fault signal; and second comparing means having an input connected to said turn-on input, and an output generating an enabling signal when said electric turn-on control quantity presents a second value higher than said first value, wherein said circuit means are connected to the output of a selected one of said first comparing means and said second comparing means; and wherein said clamping element defines a negative feedback element between said turn-on input and said output of the selected one of said first comparing means and said second comparing means.

15. A circuit as claimed in claim 14, wherein said clamping element is a transistor having a first terminal connected to said turn-on input, a second terminal connected to a reference potential line, and a control terminal connected to said circuit means.

16. A circuit as claimed in claim 14, wherein said circuit means comprises a switch located between said output of said first comparing means and said enabling terminal of said clamping element, and having a control terminal connected to said fault detecting stage.

17. A circuit as claimed in claim 14, further comprising:

a device enabling stage having an input connected to the output of the second comparing means and output connected to said device, the device enabling stage turning on the device upon receiving a device enabling signal from the second comparing means, the second comparing means generating the device enabling signal when the electric turn-on control quantity presents the second value, wherein the first comparing means is the selected comparing means.

18. A circuit for controlling turn-on of a device requiring protection against undesired conditions comprising:

a variable voltage input providing an input voltage;

a fault detecting stage that generates a fault signal upon detecting an undesired condition, said circuit comprising:

first comparator having an input connected to said variable voltage input and an output connected to said fault detecting stage, said first comparator generating a diagnostic enabling signal at its output when said input voltage presents a first value;

a clamping transistor having a base terminal supplied with a clamp enabling signal, a clamping terminal connectable to said input of said first comparator, and a reference terminal connected to a reference potential line, the clamping transistor clamping the input of the first comparator to the reference potential line when said clamp enabling signal is present; and circuit means connected to said fault detecting stage and said clamping transistor base terminal for providing said clamp enabling signal in the presence of said fault signal;

second comparator having an input connected to said variable voltage input, and an output generating a clamp disabling signal when said input voltage presents a second value higher than said first value; and a disabling element having a control terminal connected to said output of said second comparator, and a terminal connected to said clamping transistor base terminal, for generating a signal disabling said clamping transistor in the presence of said clamp disabling signal.

19. A circuit as claimed in claim 18, wherein said disabling element comprises a bipolar transistor having a base terminal connected to said output of said second comparator.

20. A circuit as claimed in claim 18, further comprising:

third comparator having an input connected to said variable voltage input and an output generating a device enabling signal when said input presents a third value higher than said second value; and a device enabling stage having an input connected to the output of the third comparator and output connected to said device, the device enabling stage turning on the device upon receiving the device enabling signal from the third comparator.

* * * * *

UNITED STATES PATENT AND TRADEMARK OFFICE
CERTIFICATE OF CORRECTION

PATENT NO. : 5,535,082
DATED : July 9, 1996
INVENTOR(S) : Edoardo Botti and Andrea Fassina It is certified that error appears in the above-indentified patent and that said Letters Patent is hereby corrected as shown below:

On the title page: Item [73] Assignee, and insert therein--SGS-Thomson Microelectronics S.r.l., Agrate Brianza, Italy--.

Signed and Sealed this

Tenth Day of December, 1996

Attest:

*Bruce Lehman*

BRUCE LEHMAN

*Attesting Officer*   *Commissioner of Patents and Trademarks*